US008871850B2

(12) United States Patent
Koh et al.

(10) Patent No.: US 8,871,850 B2
(45) Date of Patent: Oct. 28, 2014

(54) HIGHLY DIELECTRIC FILM

(75) Inventors: Meiten Koh, Osaka (JP); Kouji Yokotani, Osaka (JP); Miharu Matsumura, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 211 days.

(21) Appl. No.: 13/169,768

(22) Filed: Jun. 27, 2011

(65) Prior Publication Data

US 2011/0255211 A1 Oct. 20, 2011

Related U.S. Application Data

(63) Continuation of application No. 12/160,260, filed as application No. PCT/JP2007/051688 on Feb. 1, 2007.

(30) Foreign Application Priority Data

Feb. 1, 2006 (JP) ................................ 2006-024462
Jul. 27, 2006 (JP) ................................ 2006-204801

(51) Int. Cl.
H01G 4/32 (2006.01)
H01B 3/00 (2006.01)
H01B 3/44 (2006.01)
C09D 127/16 (2006.01)
H01G 4/12 (2006.01)
H01L 41/317 (2013.01)
H01L 41/37 (2013.01)
H01L 37/02 (2006.01)

(52) U.S. Cl.
CPC ............. *H01G 4/1227* (2013.01); *H01B 3/002* (2013.01); *H01B 3/445* (2013.01); *C09D 127/16* (2013.01); *H01L 41/317* (2013.01); *H01L 41/37* (2013.01); *H01G 4/1245* (2013.01); *H01L 37/025* (2013.01)
USPC ........... 524/436; 524/107; 524/261; 524/262; 524/317; 524/365; 524/366; 524/413; 524/545; 361/301.5; 361/323; 428/209; 428/409; 428/421; 428/463

(58) Field of Classification Search
CPC ....... H01B 3/002; H01B 3/445; H01L 37/025
USPC ............... 361/301.5, 323; 524/107, 261, 262, 524/317, 365, 366, 545; 525/256, 257, 286
See application file for complete search history.

(56) References Cited

U.S. PATENT DOCUMENTS

| 3,783,480 | A | * | 1/1974 | Booee ............................ 29/25.42 |
| 4,487,878 | A | | 12/1984 | Vasta |
| 4,518,737 | A | | 5/1985 | Traut |
| 4,546,149 | A | | 10/1985 | Kidoh et al. |
| 5,506,049 | A | | 4/1996 | Swei et al. |
| 5,919,834 | A | | 7/1999 | Downs et al. |
| 6,274,224 | B1 | | 8/2001 | O'Bryan et al. |
| 2005/0029515 | A1 | | 2/2005 | Nagai et al. |
| 2010/0027192 | A1 | * | 2/2010 | Perry et al. ..................... 361/323 |
| 2010/0202100 | A1 | * | 8/2010 | Koh et al. ..................... 361/323 |

FOREIGN PATENT DOCUMENTS

| GB | 1374342 A | * | 11/1974 |
| JP | 63-127515 A | | 5/1988 |
| JP | 63-244605 A | | 10/1988 |
| JP | 64-001216 A | | 1/1989 |
| JP | 01-114014 A | | 5/1989 |
| JP | 04-109508 A | | 4/1992 |
| JP | 2002-293610 A | | 10/2002 |
| JP | 2005-015694 A1 | | 1/2005 |
| JP | 2005-056935 A | | 3/2005 |
| JP | 2005-302435 A | | 10/2005 |

OTHER PUBLICATIONS

Liu, X. et al., "Single-Crystal-like Materials by the Self-Assembly of Cube-Shaped Lead Zirconate Titanate (PZT) Microcrystal", Langmuir, 2005, 21, pp. 3207-3212.
Knovel Critical Table, "Basic Physical Properties of Chemical Compounds", second edition, 2008.
"Plastic Material Data Sheets", MatWeb, Division of Automation Creation , Inc., 2004.

* cited by examiner

*Primary Examiner* — Nicole M Buie-Hatcher
(74) *Attorney, Agent, or Firm* — Sughrue Mion, PLLC

(57) ABSTRACT

There is provided a highly dielectric film which has high dielectric property, can be formed into a think film and is excellent in winding property (flexibility). The highly dielectric film comprises (A) a vinylidene fluoride polymer, (B) barium titanate oxide particles and/or lead zirconium titanate oxide particles, and (C) an affinity improving agent, wherein the barium titanate oxide particles and/or lead zirconium titanate oxide particles (B) and the affinity improving agent (C) are contained in amounts of 10 to 500 parts by mass and 0.01 to 30 parts by mass, respectively based on 100 parts by mass of the vinylidene fluoride polymer (A).

3 Claims, 4 Drawing Sheets

US 8,871,850 B2

HIGHLY DIELECTRIC FILM

CROSS REFERENCE TO RELATED APPLICATIONS

This application is a continuation application of U.S. application Ser. No. 12/160,260 filed Jul. 8, 2008, which is a U.S. National Stage Application of PCT/JP2007/051688 filed Feb. 1, 2007, which claims benefit of Japanese Application Nos. 2006-024462 filed Feb. 1, 2006, and 2006-204801 filed Jul. 27, 2006. The above-noted applications are incorporated herein by reference in their entirety.

TECHNICAL FIELD

The present invention relates to a highly dielectric film being useful, for example, as a dielectric film for a film condenser.

BACKGROUND ART

In recently years, plastic insulating materials are expected as film materials for film condensers for communication, electronic devices, electric power, medium and low voltage phase advancement and inverter, piezoelectric devices, pyroelectric devices and dielectric materials for transfer printing carrier since they have a high insulation resistance, excellent frequency characteristics and excellent flexibility.

A film condenser is usually comprised of a film structure comprising a dielectric polymer film subjected to aluminum or zinc deposition on its surface, or a film structure comprising multi-layers of aluminum foils and dielectric polymer films, and recently there are used a lot of condenser films comprising a dielectric polymer film and an electrode formed thereon by metal deposition.

Hydrocarbon polymers such as polypropylene, polyester and polyphenylene sulfide are studied as a dielectric polymer for a film of film condenser. However a dielectric constant of such a film itself is only about 2.3 to about 3.

It is known that a capacity of a film condenser is proportional to a dielectric constant of a film and reversely proportional to a film thickness.

Therefore, making a film thinner has been studied, but if a film is made too thin, film formation becomes difficult, and lowering of a withstand voltage is recognized. Accordingly there is a limit in making a film thinner.

For making a dielectric constant of a film itself higher, highly dielectric polyvinylidene fluoride polymer and cyanoethylated pullulan have been studied as a polymer. However dielectric constants of any of these films are not more than 20, and those polymers are materials making it difficult to make a film thinner.

In recent years, making a size of a film condenser smaller and its capacity larger has been advanced, and as a result, it is strongly demanded to make a dielectric constant higher.

As one of means for making a dielectric constant of a film condenser higher, it is proposed to incorporate inorganic particles having an especially high dielectric constant with a polymer to make a film.

For mixing highly dielectric inorganic particles to a polymer and making a film, there are known (1) a melt-kneading method and (2) a coating method.

The melt-kneading method (1) is a method of kneading highly dielectric inorganic particles and a polymer at a temperature of not less than a melting temperature of the polymer, making the mixture into a film by a melt-extrusion method or an inflation method, and if necessary, subjecting the film to stretching treatment. In this method, there are known use of a hydrocarbon polymer such as polyphenylene sulfide, polypropylene or polyester (JP2000-501549A and JP2000-294447A) and use of a vinylidene fluoride polymer (for example, JP59-43039A, JP60-185303A and JP58-69252A). However in these methods, it is difficult to produce a thin film having a high dielectric constant and few voids.

The coating method (2) is a method of producing a film by dissolving a polymer in a solvent, adding and mixing thereto highly dielectric inorganic particles to make a coating composition, and then forming a film by a coating method.

In the coating method (2), there are known use of rigid hydrocarbon polymers being excellent in heat resistance and mechanical strength such as aromatic polyamide, aromatic polyimide and an epoxy resin (JP2001-106977A, JP1-248404A, JP4-160705A, JP2-206623A and JP2002-356619A) and use of a vinylidene fluoride polymer (JP54-129397A).

In the case of using a rigid hydrocarbon polymer, it is possible to produce a thin film having a high mechanical strength but there is a large effect of a dielectric constant of the polymer itself, thereby limiting improvement of a film dielectric constant, and a film becomes hard. Therefore, it cannot be said that such a film is suitable as a film for a film condenser which is required to have excellent winding property (flexibility). A system obtained by adding and mixing highly dielectric inorganic particles to a thermosetting resin is very hard, and is used for embedded capacitor, making use of its property of being hard.

In the case of using a vinylidene fluoride polymer, it is difficult to obtain a film in which highly dielectric inorganic particles are homogeneously incorporated in a polymer, and further improvement in making a thin film and increasing a dielectric constant is required.

Further it is proposed to produce a sheet comprising highly incorporated highly dielectric inorganic particles by pressmolding composite particles prepared by coating highly dielectric inorganic particles with a vinylidene fluoride polymer (JP61-224205A). However the film is as thick as 150 μm, and cannot be said to be suitable as a film for a film condenser which is required to have excellent winding property (flexibility).

DISCLOSURE OF INVENTION

It is an object of the present invention to provide a highly dielectric film which has high dielectric property, can be made thin and is excellent in winding property (flexibility).

Namely, the present invention relates to a highly dielectric film comprising:
(A) a vinylidene fluoride (VdF) polymer,
(B) barium titanate oxide particles and/or lead zirconium titanate oxide particles, and
(C) an affinity improving agent,
wherein the barium titanate oxide particles and/or lead zirconium titanate oxide particles (B) and the affinity improving agent (C) are contained in amounts of 10 to 500 parts by mass and 0.01 to 30 parts by mass, respectively based on 100 parts by mass of the VdF polymer (A).

The present invention also relates to a coating composition for forming a highly dielectric film comprising:
(A) a vinylidene fluoride (VdF) polymer,
(B) barium titanate oxide particles and/or lead zirconium titanate oxide particles,
(C) an affinity improving agent, and
(D) a solvent, wherein the barium titanate oxide particles and/or lead zirconium titanate oxide particles (B) and the affinity improving agent (C) are contained in amounts of 10 to 500 parts by mass and 0.01 to 30 parts by mass, respectively based on 100 parts by mass of the VdF polymer (A).

Further the present invention relates to a method of producing the highly dielectric film of the present invention which is characterized by subjecting the coating composition of present invention to coating on a substrate and drying.

The highly dielectric film of the present invention is especially suitable as a film for a film condenser.

BEST MODE FOR CARRYING OUT THE INVENTION

Figure 1:
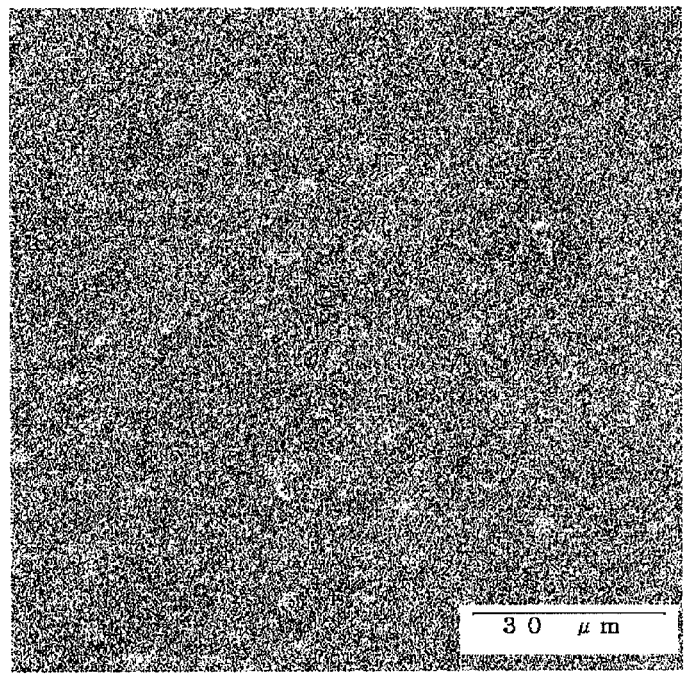
FIG. 1 A SEM photograph (magnification 1,000) of a film produced in Example 2.
Figure 2:
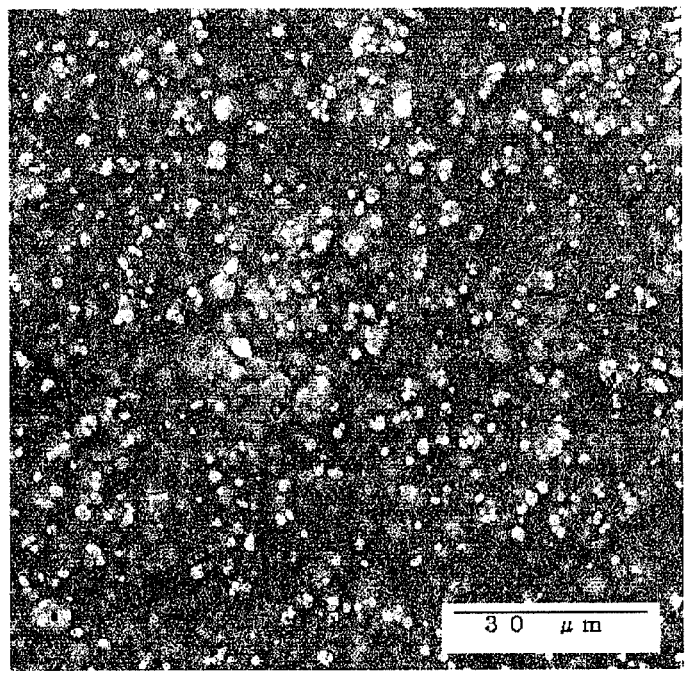
FIG. 2 A SEM photograph (magnification 10,000) of a film produced in Example 2.
Figure 3:
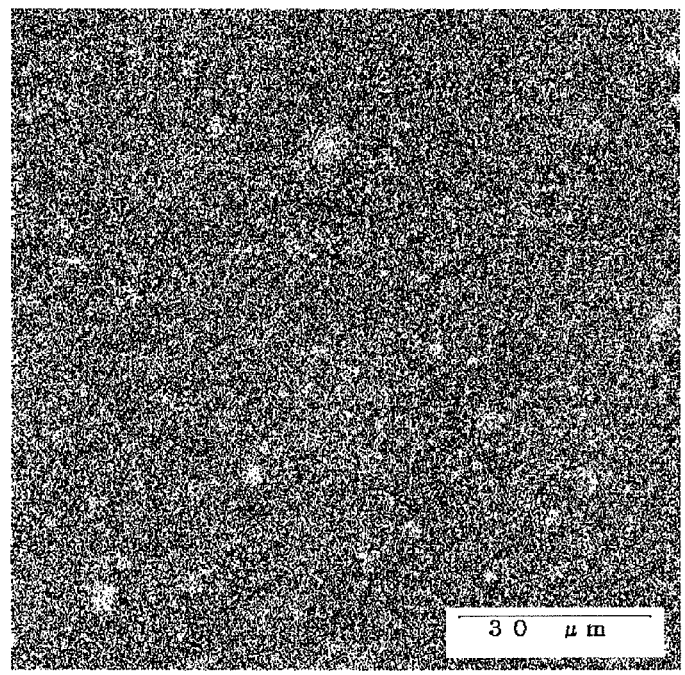
FIG. 3 A SEM photograph (magnification 1,000) of a film produced in Example 3.
Figure 4:
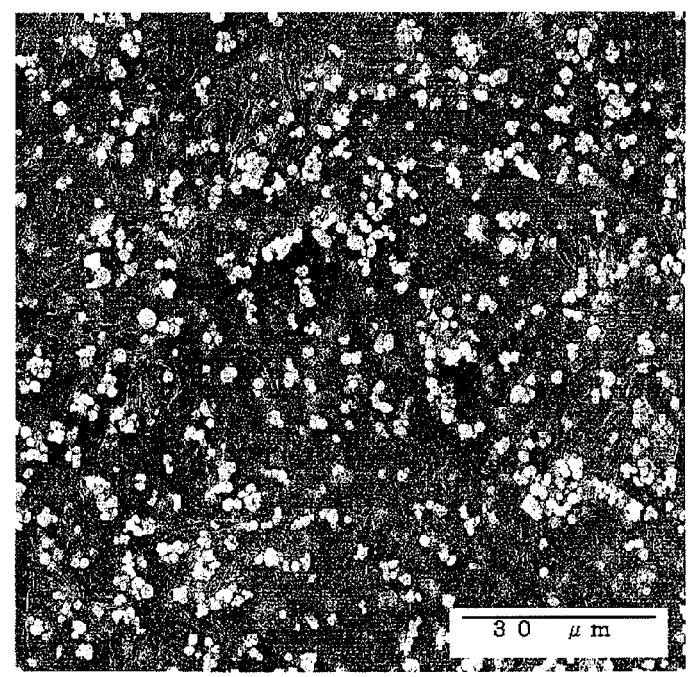
FIG. 4 A SEM photograph (magnification 10,000) of a film produced in Example 3.
Figure 5:
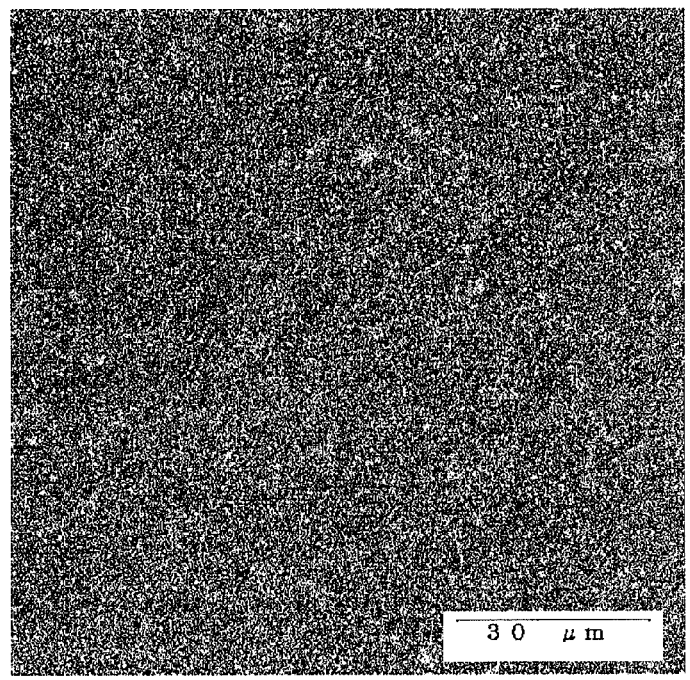
FIG. 5 A SEM photograph (magnification 1,000) of a film produced in Example 18.
Figure 6:
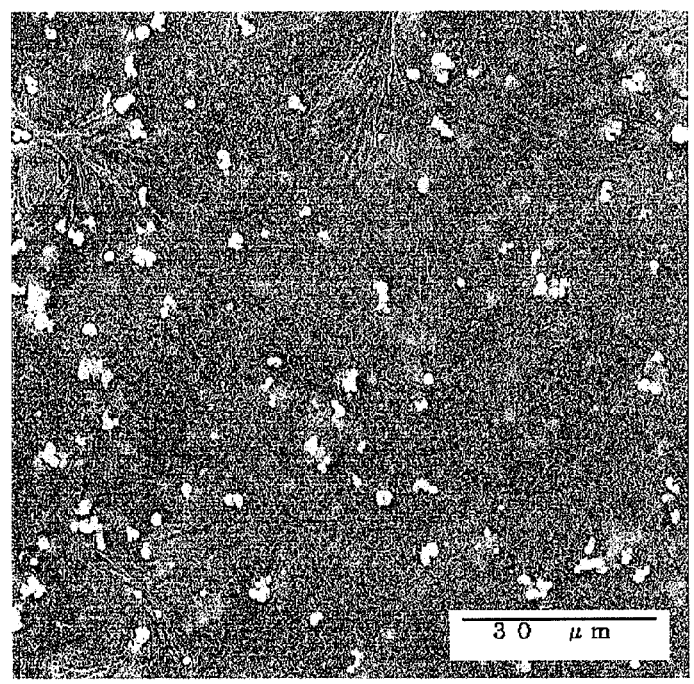
FIG. 6 A SEM photograph (magnification 10,000) of a film produced in Example 18.

The highly dielectric film of present invention is one comprising:
(A) a VdF polymer,
(B) barium titanate oxide particles and/or lead zirconium titanate oxide particles, and
(C) an affinity improving agent,
wherein the barium titanate oxide particles and/or lead zirconium titanate oxide particles (B) and the affinity improving agent (C) are contained in amounts of 10 to 500 parts by mass and 0.01 to 30 parts by mass, respectively based on 100 parts by mass of the VdF polymer (A).

The VdF polymer may be a homopolymer of VdF or may be a copolymer comprising VdF and other copolymerizable monomer. Also the VdF polymer may be a blend of a homopolymer of VdF and a VdF copolymer or may be a blend of VdF copolymers.

Examples of the other copolymerizable monomer are, for instance, fluorine-containing olefins such as tetrafluoroethylene (TFE), chlorotrifluoroethylene (CTFE), trifluoroethylene, monofluoroethylene, hexafluoropropylene (HFP) and perfluoro(alkyl vinyl ether) (PAVE); a fluorine-containing acrylate and a fluorine-containing monomer having functional group. Among these, HFP, TFE and CTFE are preferable from the viewpoint of satisfactory solubility in a solvent. A proportion of the VdF is not less than 50% by mole, preferably not less than 60% by mole, from the viewpoint of a high dielectric constant and high solubility in a solvent. In the case of a VdF/TFE copolymer, it is preferable that the copolymer comprises 60 to 95% by mole of a VdF unit and 5 to 40% by mole of a TFE unit, especially preferably 70 to 90% by mole of a VdF unit and 10 to 30% by mole of a TFE unit, since a withstand voltage becomes high. A dielectric constant (20° C., 1 kHz) of the VdF polymer is preferably not less than 7, further not less than 7.5, from the viewpoint of further increasing a dielectric constant of a film.

The barium titanate oxide particles and/or lead zirconium titanate oxide (PZT) particles (B) (hereinafter may be simply referred to as "specific titanium oxide particles (B)") are representative highly dielectric inorganic particles, and a dielectric constant thereof is not less than 500. Especially barium titanate oxide particles are preferable since they have a high dielectric constant exceeding 1,500, and are easily formed into fine particles.

An average particle size of the specific titanium oxide particles (B) is preferably not more than 2 μm, especially preferably from 0.01 to 0.5 μm, particularly preferably from about 0.01 μm to about 0.2 μm, from the viewpoint of excellent smoothness of a film surface and satisfactory homogeneous dispersibility.

An amount of the specific titanium oxide particles (B) is not less than 10 parts by mass, preferably not less than 30 parts by mass, especially preferably not less than 50 parts by mass based on 100 parts by mass of the VdF polymer. When its amount is too small, an effect of improving a dielectric constant of a film becomes smaller. An upper limit thereof is 500 parts by mass. When the amount is too large, there occur problems with strength of a film and film surface roughness. A preferable upper limit is 400 parts by mass, further 300 parts by mass.

The affinity improving agent (C) is a component playing a role of not only improving affinity of the VdF polymer (A) for the specific titanium oxide particles (B) and dispersing the both homogeneously but also strongly bonding the specific titanium oxide particles (B) and the VdF polymer (A) in the film. Without this component (C), voids are easily generated in the film, and a dielectric constant is decreased. Further, in the film forming composition explained infra, the component (C) functions to homogeneously disperse the specific titanium oxide particles and the VdF polymer.

Examples of the effective affinity improving agent (C) are a coupling agent (C1), a surfactant (C2) and an epoxy group-containing compound (C3).

Examples of the coupling agent (C1) are, for instance, a titanium coupling agent, a silane coupling agent, a zirconium coupling agent and a zircoaluminate coupling agent.

Examples of the titanium coupling agent are, for instance, those of monoalkoxy type, chelate type and coordinate type, and especially from the viewpoint of satisfactory affinity for the specific titanium oxide particles (B), monoalkoxy type and chelate type are preferable.

Examples of the silane coupling agent are, for instance, those of high molecular weight type and low molecular weight type, and from the viewpoint of the number of functional groups, there are monoalkoxysilane, dialkoxysilane, trialkoxysilane and Dipodal alkoxysilane. Especially from the viewpoint of satisfactory affinity for the specific titanium oxide particles (B), alkoxysilanes of low molecular weight type are preferable.

Examples of the zirconium coupling agent are, for instance, monoalkoxyzirconium and trialkoxyzirconium.

Examples of the zircoaluminate coupling agent are, for instance, monoalkoxyzircoaluminate and trialkoxyzircoaluminate.

Examples of the surfactant (C2) are those of high molecular weight type and low molecular weight type, and from the viewpoint of kind of functional groups, there are a nonionic surfactant, an anionic surfactant and a cationic surfactant. Those can be used, and surfactants of high molecular weight type are preferable from the viewpoint of satisfactory thermal stability.

Examples of the nonionic surfactant are, for instance, polyether derivatives, polyvinyl pyrrolidone derivatives and alcohol derivatives, and polyether derivatives are preferable especially from the viewpoint of satisfactory affinity for the specific titanium oxide particles (B).

Examples of the anionic surfactant are, for instance, polymers having moiety of sulfonic acid, carboxylic acid or salt thereof, and especially from the viewpoint of satisfactory affinity for the VdF polymer (A), preferable are acrylic acid derivative polymers, methacrylic acid derivative polymers, and maleic anhydride copolymers.

Examples of the cationic surfactant are, for instance, amine compounds, compounds having a nitrogen-containing complex ring such as imidazoline, and halogenated salts thereof, and compounds having a nitrogen-containing complex ring are preferable since they have less property of attacking the VdF polymer (A). Examples of the salts are ammonium salts having halogen anion such as alkyltrimethylammonium chloride. From the viewpoint of a high dielectric constant, ammonium salts having halogen anion are preferable.

Examples of the epoxy group-containing compound (C3) are epoxy compounds and glycidyl compounds, which may be low molecular weight compounds or high molecular weight compounds. Particularly preferable are low molecular weight compounds having one epoxy group from the viewpoint of especially satisfactory affinity for the VdF polymer (A). In the present invention, epoxy group-containing coupling agents (for example, epoxysilane) which are classified into a coupling agent (C1) are included in the coupling agent (C1) but not in the epoxy group-containing compound (C3).

From the viewpoint of especially satisfactory affinity for the VdF polymer (A), preferable examples of the epoxy group-containing compound (C3) are compounds represented by the formula (C3):

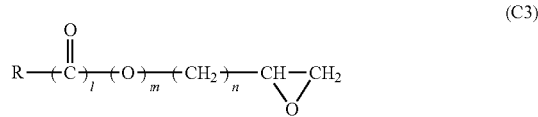

(C3)

wherein R is hydrogen atom, a monovalent hydrocarbon group having 1 to 10 carbon atoms which may have oxygen atom, nitrogen atom or carbon-carbon double bond, or an aromatic ring which may have a substituent; l is 0 or 1; m is 0 or 1; n is 0 or an integer of 1 to 10.

Examples thereof are:

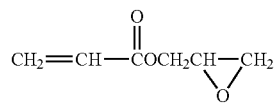

and the like, which have a ketone group or an ester group.

An amount of the component (C) is not less than 0.01 part by mass, preferably not less than 0.1 part by mass, especially preferably not less than 1 part by mass based on 100 parts by mass of the VdF polymer. When its amount is too small, dispersing homogeneously becomes difficult. An upper limit thereof is 30 parts by mass. When its amount is too large, there occurs a problem that a dielectric constant of an obtained film is decreased. A preferable upper limit is 25 parts by mass, further 20 parts by mass.

From the viewpoint of satisfactory affinity for the specific titanium oxide particles (B), the coupling agent (C1) and the epoxy group-containing compound (C3) are preferable as the component (C), and especially titanium coupling agents and silane coupling agents are preferable from the viewpoint of satisfactory affinity for both of the VdF polymer (A) and the specific titanium oxide particles (B).

In addition, the coupling agent (C1) and the epoxy group-containing compound (C3) exhibit more satisfactory affinity improving action since they form a chemical bond with the specific titanium oxide particles (B) (having a reaction group).

The film of the present invention may contain, as optional components, other polymer and other highly dielectric inorganic particles and in addition, additives such as various fillers such as a reinforcing filler and an antistatic filler and an affinity improving agent.

Preferable examples of other polymer are polycarbonate (PC), polyester, polyethylene terephthalate (PET), polyethylene naphthalate (PEN), silicone resin, polyether, polyvinyl acetate, polyethylene, and polypropylene for improving flexibility; poly(meth)acrylate, epoxy resin, polyphenylene oxide (PPO), polyphenylene sulfide (PPS), polyamide (PA), polyimide (PI), polyamide imide (PAI), polycarbonate, polystyrene and polybenzimidazole (PBI) for increasing strength; and odd number polyamide, cyano pullulan, and copper phthalocyanine polymer for supplementing high dielectric property. These other polymers may be blended to an extent not to impair the object of the present invention.

In the present invention, combination use of other highly dielectric inorganic particles is not prohibited, and known highly dielectric inorganic particles may be blended. Examples of such other highly dielectric inorganic particles are, for instance, zinc titanate, strontium titanate, calcium titanate, magnesium titanate, lead titanate, titanium oxide, barium antimonite, magnesium antimonite, strontium antimonite, calcium antimonite, lead antimonite, barium stannate, strontium stannate, and complex compounds, solid solutions and mixtures thereof. These other highly dielectric inorganic particles may be blended to an extent not to impair the object of the present invention. In addition, highly dielectric organic particles, for example, copper phthalocyanine tetramer may be blended to an extent not to impair the object of the present invention.

Examples of a reinforcing filler are, for instance, particles and fibers of silicon carbide, silicon nitride, magnesium oxide, potassium titanate, glass, alumina, and boron compounds, and examples of an affinity improving agent are, for instance, polyolefin modified with functional group, styrene-modified polyolefin, polystyrene modified with functional group, polyacrylate imide and cumyl phenol. These may be blended to an extent not to impair the object of the present invention.

The highly dielectric film of the present invention can be produced by either of the above-mentioned melt-kneading method (1) and the coating method (2). From the viewpoint of easy production and excellent homogeneity of an obtained film, it is advantageous to produce by the coating method (2).

In the case of producing a highly dielectric film by the coating method, first a coating composition is prepared. The coating composition of the present invention is a composition comprising:

(A) a VdF polymer,
(B) barium titanate oxide particles and/or lead zirconium titanate oxide particles,
(C) an affinity improving agent, and
(D) a solvent, wherein the barium titanate oxide particles and/or lead zirconium titanate oxide particles (B) and the affinity improving agent (C) are contained in amounts of 10 to 500 parts by mass and 0.01 to 30 parts by mass, respectively based on 100 parts by mass of the VdF polymer (A).

With respect to examples and amounts of the VdF polymer (A), the specific titanium oxide particles (B), the affinity improving agent (C) and other optional components, the above-mentioned explanations can be applied.

It is preferable to adjust a viscosity of this composition to 0.01 to 3 Pa·s with the solvent (D) since coatability is satisfactory and a uniform and smooth film can be obtained. It is especially preferable that the viscosity is not more than 1.5 Pa·s, from the viewpoint of inhibiting roughening of its surface.

A form of the composition may be an emulsion (a solvent is water, etc.). In this case, since both of the VdF polymer and the component (B) are in the form of particles, a particle-particle mixture system is formed and it is difficult to homogeneously disperse them. Therefore it is preferable to prepare a solution of the VdF polymer (A) dissolved in an organic solvent and disperse the component (B) in that solution of the VdF polymer because the particles are easily dispersed homogeneously and a homogeneous film can be easily obtained.

Preferable examples of the organic solvent (D) dissolving the VdF polymer (A) are, for instance, amide solvents such as N,N-dimethylformamide (DMF), N-methylpyrrolidone (NMP) and N,N-dimethylacetamide (DMAc); ketone solvents such as cyclohexane, methyl isobutyl ketone (MIBK) and 2-hetanone (MAK); ester solvents such as butyl acetate and ethyl lactate; ether solvents such as ethyl cellosolve and methyl cellosolve; and carbonate solvents such as propylene carbonate and diethylene carbonate (DEC), and from the viewpoint of especially excellent solubility of the VdF polymer, amide solvents are preferable. These solvents may be used alone or may be mixed optionally. Especially a solvent mixture comprising an amide solvent as a main solvent and an ester, ketone, ether or carbonate solvent as an auxiliary solvent has good wettability to a substrate and therefore is suitable for forming a thin uniform film having less pin holes. Particularly for enhancing solubility of the VdF polymer (A), it is preferable to adjust a dielectric constant of a solvent to be not less than 22, and for improving coatability, it is preferable to adjust a surface tension of a solvent to be not more than 35 dyn/cm.

In addition to the solvent (D), to the coating composition may be added a defoaming agent, a dispersant, a wetting agent, a leveling agent and a flowing agent as components not remaining in the film (disappearing at the time of forming the film) or as components which do not give substantial influence on the effects (high dielectric constant, flexibility, formation of thin film) aimed at by the film of the present invention even if they are present in the film.

The coating composition is prepared by preparing an organic solvent (D) solution of the VdF polymer (A), optionally adding other components thereto, and then forcedly stirring and dispersing the mixture. Specifically there are the following methods for the preparation.

(1) A method of previously mixing, stirring and dispersing the component (B) and the component (C) in the solvent (D), and then sufficiently stirring and dispersing the obtained dispersed mixture and the VdF polymer (A):

In this method, in the case where the affinity improving agent (C) is the silane coupling agent (C1) or the epoxy group-containing compound (C3) which is a chemically reactive affinity improving agent, the components (C) and (B) may be subjected to forced stirring and dispersing after the reaction thereof, or may be added to the solvent (D) and then subjected to the reaction and forced stirring and dispersing simultaneously, or the both may be carried out in combination (there is a case where this is referred to as surface treatment of the component (B)). When the affinity improving agent is the surfactant (C2), since a reaction does not occur, it is easy to add the components (B) and (C) in the solvent (D) and then carry out the reaction and forced stirring and dispersing simultaneously.

For enhancing stability of a dispersed mixture of the components (B) and (C), it is desirable that a small amount of a solution of the VdF polymer (A) is present when forcedly stirring and dispersing the components (B) and (C).

(2) A method of adding the components (B) and (C) in a solvent (D) solution of the component (A) batchwise or in order and carrying out forced stirring and dispersing:

When adding in order, the order of adding is not limited particularly, and forced stirring and dispersing treatment may be carried out every time when one component is added.

In any of the above-mentioned methods (1) and (2), it is desirable to previously remove adsorbed water on a surface of the component (B) by heat treatment or the like since homogeneous dispersibility is further improved. By subjecting the component (B) to pre-heat treatment or surface treatment, homogeneous dispersing becomes easy even in the case of the component (B) having a large average particle size. It is desirable to undergo the both of pre-heat treatment and surface treatment.

A specified amount of each component may be added batchwise or dividedly. Further when adding dividedly, the adding order and the divided addition may be combined freely, for example, in such a manner that a part of the component (A) is previously added when mixing the components (B) and (C), and the remaining component (A) is added after the mixing, and further the component (C) is added and mixed additionally.

Here an important point is to sufficiently carry out forced stirring and dispersing. If this dispersing treatment is insufficient, there is a case where solid contents such as the component (B) are easily precipitated, thereby making coating difficult, and in some cases, at forming a coating film by drying, phase separation occurs inside the film, and a uniform film being excellent in mechanical characteristics and having stable dielectric characteristics cannot be formed. This forced stirring and dispersing treatment may be carried out for the prepared composition just before the coating.

The forced stirring and dispersing is to be carried out to such an extent that the composition after the stirring and dispersing does not cause phase separation (a change of turbidity of the solution is small (10% or less)) even in the case of allowing the composition to stand at room temperature (25° C.) for seven days. A degree of the stirring and dispersing can be set by preliminary experiments.

Preferable examples of forced stirring and dispersing equipment are ball mill, sand mill, attrition mill, Visco Mill, roll mill, banbury mixer, stone mill, vibrator mill, dispersing mill, disc impeller, jet mill and DYNO-MILL. Among these, jet mill, roll mill and DYNO-MILL are preferable from the viewpoint that mixing of impurities hardly occurs and continuous production can be carried out.

Nonlimiting examples of the stirring and dispersing conditions are as follows.
Equipment: Sand mill
Stirring conditions:
 Stirring speed: 100 to 10,000 rpm
 Stirring time: 5 to 120 minutes
 Others: Glass beads are used.

A film is formed using the obtained homogeneous coating composition. It is preferable to carry out film formation by coating the composition on a substrate and then drying and if necessary, peeling the film from the substrate, from the viewpoint of easy working, a simple structure of equipment and easy control of a film thickness. Also film formation may be conducted by other film forming methods such as a method of Langmuir-Blodgett's technique and an impregnation method.

For the coating, a knife coating method, a cast coating method, a roll coating method, a gravure coating method, a blade coating method, a rod coating method, an air doctor coating method, a curtain coating method, a Faknelane coating method, a kiss coating method, a screen coating method, a spin coating method, a spray coating method, an extrusion coating method, and an electrodeposition coating method can be employed. Among these, a roll coating method, a gravure coating method and a cast coating method are preferable from the viewpoint that operation is easy, non-uniformity of a film thickness is small and productivity is satisfactory.

Drying can be conducted using Yankee cylinder, counter flow, hot air blasting, air flow cylinder, air through, infrared ray, microwave, and induction heating. For example, in the case of a hot air blasting method, the drying conditions of 130° to 200° C. for a period of time of one minute or less are suitably adopted.

The highly dielectric film of the present invention may be left on a substrate as a so-called coating film. When the film is used as a film for a film condenser, it is separated from a substrate and used in the form of a single film. Therefore preferable materials for a substrate are those from which a VdF polymer is easily peeled, for example, metallic sheets of stainless steel and copper; glass sheet; polymer films subjected to ITO and ZnO deposition; and polymer films having good releasing property. Examples of suitable polymer films are engineering plastics such as polyethylene terephthalate (PET), polyethylene naphthalate (PEN), polycarbonate (PC), polyamide (PA), polyimide (PI), polyamide imide (PAI), polybenzimidazole (PBI), polyphenylene sulfide (PPS), polyphenylene oxide (PPO) and polysulfone (PSF).

When the film is left on a substrate as a coating film, the composition of the present invention can be coated on a polymer film and dried to make a laminated film. Preferable as a substrate for the laminated film are polymer films which have good adhesion to the VdF polymer (A) and have a thickness of about 1.5 to 3 μm. Examples of suitable polymers are engineering plastics such as PET, PEN, PC, PA, PI, PAI, PBI, PPS, PPO and polysulfone (PSF).

A single film is used as it is, and may be stretched by usual method. In that case, a stretching ratio is desirably about 2 to 6 times.

In any of single films and laminated films, they may be subjected to surface treatment with other kind of polymer or plasma treatment or corona discharge treatment in order to make deposition of aluminum for an electrode easy. In addition, in order to inhibit roughening of a film surface, other kind of polymer may be coated on a film surface, and in order to improve film strength, a film may be subjected to crosslinking treatment with ultraviolet ray, electron beam or radiation. Further, a film may be subjected to pressing, for example, pressing with rolls. In that case, surface smoothness of a film is improved.

A thickness of the so-obtained highly dielectric film of the present invention can be not more than 9 μm, preferably not more than 6 μm, further preferably not more than 5 μm. A lower limit of the film thickness varies depending on kind of a polymer and a particle size and an amount of the component (B), and is about 3 μm from the viewpoint of maintaining mechanical strength of a film.

In the highly dielectric film of the present invention, in spite of the content of specific titanium oxide particles (B) being relatively high (60% by mass or more), a film thickness can be made thin, and therefore electrostatic capacity can be made high. For example, when barium titanate particles having a dielectric constant of 2,000 are used as the component (B) and a content thereof is 100% by mass, a dielectric constant of the film can be 30 or more. In this case, assuming an area of a circular electrode is 9.5 mm$^2$, an electrostatic capacity of a film having a thickness of 9 μm is 2.8 nF or more, and an electrostatic capacity of a film having a thickness of 6 μm is 4.2 nF or more.

Also according to the film of the present invention, since the specific titanium oxide particles (B) are bonded firmly to the VdF polymer (A) by an action of a coupling agent or a surfactant, a dense structure having a small void content (for example, not more than 5% by volume, further not more than 1% by volume) is obtained and a withstand voltage can be made high.

In spite of a dense structure, the film of the present invention is excellent in flexibility (winding property). For example, in the case of a 5 μm thick film, neither cracking nor breaking occurs at 180 degree bending test. Therefore when the film is used for a film condenser, processability (winding property and followability) are significantly improved.

The film of the present invention is excellent in surface smoothness, and for example, surface roughness of its center can be not more than ±1 μm, further not more than ±0.6 μm. Uniformity of electrical characteristics is improved due to excellent surface smoothness.

When the highly dielectric film of the present invention is used, for example, as a film for a film condenser, an electrode can be formed on its surface by a deposition method or the like. With respect to a material of an electrode, and a method and conditions for forming an electrode, those generally known can be employed.

The highly dielectric film of the present invention is useful especially as a film for a film condenser, and also useful as a film for piezoelectric element, a film for a pyroelectric device, a dielectric film for transfer printing carrier and a film for strong dielectric element.

EXAMPLES

The present invention is then explained by means of Examples, but is not limited to them.

Characteristic values used herein are those measured by the following methods.
(Viscosity)

For measuring a viscosity, a cone plate viscometer VIS-CONE CV Series available from Misec Corporation is used. Measuring conditions are room temperature and the number of rotations of 94 rpm, and No. 2 cone (10p) is used.
(Dispersion Stability)

A dispersion is poured in a 50 ml glass sample bottle and allowed to stand at room temperature. One week after, dispersibility is observed with naked eyes. When homogeneity is kept, it is evaluated as ◯, and when precipitation occurs, it is evaluated as X.
(Dielectric Constant)

Using a film of a mixture of a polymer and inorganic particles formed on a metallic substrate or a film of a mixture of a polymer and inorganic particles subjected to aluminum deposition on one surface thereof, a sample is produced by aluminum deposition in vacuo on a 95 mm² area of a film surface opposite to the substrate (or the aluminum-deposited surface). An electrostatic capacity and a dielectric loss of this sample are measured at room temperature (25° C.) at a frequency of 100 Hz, 1 kHz, 10 kHz and 100 kHz using an impedance analyzer (HP4194A available from Hewlett Packard).

(Film Thickness)

A thickness of a film on a substrate is measured at room temperature using a film thickness meter (CMI223 available from Oxford Instruments) adjusting zero point depending on a substrate and calibrated by two-point reference thicknesses.

(Flexibility)

After bending a film having a length of 20 mm, a width of 5 mm and a thickness of 5 μm by 180 degrees, cracking and deformation at a bent portion are observed with naked eyes. When there is neither cracking nor deformation at the bent portion, it is evaluated as ◯.

(Content of Void)

A theoretical density P of a film comprising (1−w) part by weight of a polymer having a density PA and w part by weight of inorganic particles having a density PB is shown by the following equation.

$$P=(1-w)PA+wPB$$

A void ratio α (%) of a film is calculated by the following equation from a real density PC of the film obtained by a density grading method.

$$\alpha(\%)=\{1-(P/PC)\times 100\}$$

(Surface Center Roughness)

For measuring surface center roughness, SURFTEST SV-600 available from Mitsutoyo Corporation is used, and an arithmetic mean roughness (Ra) is determined according to JIS B 0601-1994.

(Observation with Scanning Electron Microscope (SEM))

Microscope: S-4000 available from Hitachi, Ltd.

Example 1

Into a 3-liter separable flask were poured 900 parts by mass of N-methylpyrrolidone (NMP) (available from Tokyo Chemical Industry Co., Ltd.) and 100 parts by mass of polyvinylidene fluoride (PVdF) polymer (VP832 available from DAIKIN INDUSTRIES, LTD., dielectric constant: 9.8 (1 kHz, 25° C.)), and 4-hour stirring was carried out at 80° C. under nitrogen gas atmosphere with a mechanical stirrer to obtain a polymer solution having a concentration of 10% by mass. This polymer solution was a light-yellow homogeneous solution.

To this NMP solution of PVdF were added 100 parts by mass of barium titanate (BT-01 available from Sakai Chemical Industry Co., Ltd.) having an average particle size of 0.1 μm and further 10 parts by mass of PLANEACT KR-55 available from AJINOMOTO CO., INC. as a titanium coupling agent.

To this mixture was added the same mass of glass beads (GB503M available from Potters-Ballotini Co., Ltd.) as that of the mixture, and the obtained mixture was put in a water-cooled three drum type sand grinder (A•VIEX available from AIMEX), followed by 60-minute dispersing treatment at room temperature at 1,000 rpm. After the dispersing treatment, the mixture was passed through a stainless steel mesh to remove glass beads and obtain the composition of the present invention.

A viscosity and dispersion stability of this composition were evaluated. The results are shown in Table 1.

Then the obtained composition was coated on a stainless steel substrate with a bar coater, and dried with hot air at 180° C. for one minute to form an about 5.1 μm thick dielectric film.

A dielectric constant at each frequency, flexibility, surface center roughness and void content of the obtained film were evaluated. The results are shown in Table 1.

Examples 2 to 10

Compositions of the present invention were prepared in the same manner as in Example 1 except that amounts of PVdF, barium titanate and a titanium coupling agent were changed as shown in Table 1, and a viscosity and dispersion stability thereof were evaluated. Further dielectric films were formed in the same manner as in Example 1, and a dielectric constant at each frequency, flexibility, surface center roughness and void content of the obtained films were evaluated. The results are shown in Table 1.

TABLE 1

|  | Example | | | | | | | | | |
| --- | --- | --- | --- | --- | --- | --- | --- | --- | --- | --- |
|  | 1 | 2 | 3 | 4 | 5 | 6 | 7 | 8 | 9 | 10 |
| Composition (part by mass) | | | | | | | | | | |
| Solvent (NMP) | 900 | 900 | 850 | 800 | 850 | 900 | 900 | 900 | 900 | 900 |
| PVdF | 100 | 100 | 150 | 200 | 150 | 100 | 100 | 100 | 100 | 100 |
| Barium titanate | 100 | 150 | 225 | 300 | 225 | 150 | 150 | 150 | 150 | 150 |
| Coupling agent | 10 | 15 | 22.5 | 30 | 11.3 | 1.5 | 15 | 15 | 7.5 | 1.5 |
| Characteristics of composition | | | | | | | | | | |
| Dispersion stability | ◯ | ◯ | ◯ | ◯ | ◯ | ◯ | ◯ | ◯ | ◯ | ◯ |
| Viscosity (Pa · s) | 0.58 | 0.58 | 1.45 | 1.58 | 0.59 | 0.59 | 0.59 | 0.59 | 0.59 | 0.59 |
| Characteristics of film | | | | | | | | | | |
| Film thickness (μm) | 5.1 | 5.2 | 4.8 | 5.2 | 4.9 | 5.0 | 3.2 | 8.4 | 6.5 | 7.2 |
| Dielectric constant 100 Hz | 37 | 65 | 64 | 63 | 64 | 64 | 64 | 64 | 63 | 61 |
| 1 kHz | 35 | 60 | 63 | 62 | 62 | 62 | 63 | 63 | 61 | 59 |
| 10 kHz | 34 | 58 | 59 | 59 | 60 | 60 | 59 | 59 | 58 | 57 |
| 100 kHz | 31 | 55 | 56 | 57 | 58 | 58 | 56 | 56 | 55 | 53 |
| Flexibility | ◯ | ◯ | ◯ | ◯ | ◯ | ◯ | ◯ | ◯ | ◯ | ◯ |
| Surface center roughness (μm) | 0.4 | 0.5 | 1.5 | 1.8 | 0.6 | 0.5 | 0.4 | 0.5 | 0.4 | 0.4 |
| Content of void (%) | <1 | <1 | <1 | <1 | <1 | <1 | <1 | <1 | <1 | <1 |

Examples 11 to 24

Compositions of the present invention were prepared in the same manner as in Example 1 except that various surfactants were added in an amount of 10% by mass based on barium titanate instead of the titanium coupling agent and amounts of PVdF and barium titanate were changed as shown in Table 2, and dispersion stability thereof was evaluated. Further dielectric films were formed in the same manner as in Example 1, and a dielectric constant at each frequency and flexibility of the obtained films were evaluated. The results are shown in Table 2.

Added surfactants S1 to S13 are as follows.

S1: Nonionic surfactant (poly-oxyethylene-distyrene-phenyl-ether) (EMULGEN A60 available from KAO CORPORATION)
S2: Anionic surfactant (special polycarboxylic acid polymer surfactant) (HOMOGENOL L18 available from KAO CORPORATION)
S3: Cationic surfactant (imidazoline surfactant) (HOMOGENOL L95 available from KAO CORPORATION)
S4: Nonionic surfactant (sorbitan monooleate) (REODOL sp10 available from KAO CORPORATION)
S5: Nonionic surfactant (alkylglukoxide) (MIDOL 10 available from KAO CORPORATION)
S6: Cationic surfactant (amine type polymer surfactant) (DisperByk 180 available from BYK-Chemie GmbH)
S7: Anionic surfactant (carboxylic acid polymer surfactant) (DisperByk 182 available from BYK-Chemie GmbH)
S8: Anionic surfactant (poly-ester-acid amine salt) (ED 117 available from KUSUMOTO CHEMICALS, LTD.)
S9: Anionic surfactant (poly-carboxylic acid-amide amine salt with high Mw) (ED211 available from KUSUMOTO CHEMICALS, LTD.)
S10: Anionic surfactant (poly-ether-ester-amine salt with high Mw) (ED214 available from KUSUMOTO CHEMICALS, LTD.)
S11: Cationic surfactant (chlorinated alkyltrimethyl ammonium) (Arcade T50 available from LION CORPORATION)
S12: Cationic surfactant (chlorinated alkylbis(2-hydroxyethyl)methyl ammonium salt) (ESOCARD C12 available from LION CORPORATION)
S13: Anionic surfactant (polyoxyethylene alkylamine) (EnomineC12 available from LION CORPORATION)

Comparative Examples 1 to 3

Compositions for comparison were prepared in the same manner as in Example 1 except that a titanium coupling agent was not added, PVdF and barium titanate were added in amounts as shown in Table 3, and dispersion treatment was not carried out in Comparative Examples 1 and 2, and a viscosity and dispersion stability thereof were evaluated. Further dielectric films were formed in the same manner as in Example 1, and a dielectric constant at each frequency, flexibility, surface center roughness and content of void of the obtained films were evaluated. The results are shown in Table 3.

TABLE 3

| | Comparative Example | | |
|---|---|---|---|
| | 1 | 2 | 3 |
| Composition (part by mass) | | | |
| Solvent (NMP) | 900 | 900 | 850 |
| PVdF | 100 | 100 | 150 |
| Barium titanate | 100 | 150 | 225 |
| Dispersion treatment | none | none | conducted |
| Characteristics of composition | | | |
| Dispersion stability | X | X | X |
| Viscosity (Pa · s) | 0.56 | 0.58 | 1.45 |
| Characteristics of film | | | |
| Film thickness (μm) | 5.5 | 5.1 | 4.8 |
| Dielectric constant | | | |
| 100 Hz | 12 | 21 | 22 |
| 1 kHz | 12 | 20 | 21 |
| 10 kHz | 11 | 19 | 19 |
| 100 kHz | 10 | 17 | 16 |
| Flexibility | ○ | ○ | ○ |
| Surface center roughness (μm) | 1.5 | 2.1 | 1.8 |
| Content of void (%) | 4.5 | 5.0 | 4.5 |

Comparative Example 4

A composition for comparison was prepared in the same manner as in Example 1 according to the same formulations as in Example 1 except that aromatic polyamide imide (HI680 available from Hitachi Chemical Co., Ltd.) was used as a

TABLE 2

| | Example | | | | | | | | | | | | | |
|---|---|---|---|---|---|---|---|---|---|---|---|---|---|---|
| | 11 | 12 | 13 | 14 | 15 | 16 | 17 | 18 | 19 | 20 | 21 | 22 | 23 | 24 |
| Composition (part by mass) | | | | | | | | | | | | | | |
| Solvent (NMP) | 900 | 900 | 900 | 900 | 850 | 900 | 900 | 800 | 800 | 800 | 800 | 800 | 800 | 800 |
| PVdF | 100 | 100 | 100 | 100 | 150 | 100 | 100 | 200 | 200 | 200 | 200 | 200 | 200 | 200 |
| Barium titanate | 100 | 100 | 100 | 100 | 150 | 100 | 100 | 300 | 300 | 300 | 300 | 300 | 300 | 300 |
| Surfactant | S1 | S2 | S3 | S4 | S5 | S6 | S7 | S3 | S8 | S9 | S10 | S11 | S12 | S13 |
| (amount) | (10) | (10) | (10) | (10) | (15) | (10) | (10) | (30) | (30) | (30) | (30) | (30) | (30) | (30) |
| Characteristics of composition | | | | | | | | | | | | | | |
| Dispersion stability | ○ | ○ | ○ | ○ | ○ | ○ | ○ | ○ | ○ | ○ | ○ | ○ | ○ | ○ |
| Characteristics of film | | | | | | | | | | | | | | |
| Film thickness (μm) | 5.2 | 4.8 | 5.5 | 5.2 | 4.9 | 5.5 | 5.4 | 4.5 | 5.5 | 4.7 | 5.1 | 5.1 | 4.1 | 4.9 |
| Dielectric constant 100 Hz | 33 | 36 | 41 | 29 | 28 | 29 | 29 | 66 | 31 | 40 | 38 | 2673 | 3424 | 22 |
| 1 kHz | 25 | 34 | 26 | 29 | 23 | 26 | 28 | 41 | 27 | 37 | 34 | 281 | 1119 | 20 |
| 10 kHz | 22 | 33 | 19 | 26 | 21 | 22 | 27 | 31 | 27 | 36 | 33 | 83 | 327 | 19 |
| 100 kHz | 21 | 32 | 15 | 25 | 20 | 20 | 24 | 26 | 26 | 34 | 32 | 42 | 88 | 18 |
| Flexibility | ○ | ○ | ○ | ○ | ○ | ○ | ○ | ○ | ○ | ○ | ○ | ○ | ○ | ○ | polymer instead of PVdF, and dispersion stability thereof was evaluated. Further a dielectric film was formed in the same manner as in Example 1, and a dielectric constant at each frequency, flexibility and void content of the obtained film were evaluated. The results are shown in Table 4.

A film having a thickness of not more than 10 μm could not be formed because the obtained film was low in flexibility and fragile.

Comparative Example 5

A composition for comparison was prepared in the same manner as in Example 1 according to the same formulations as in Example 12 except that aromatic polyamide imide (HI680 available from Hitachi Chemical Co., Ltd.) was used as a polymer instead of PVdF and 150 pats by mass of barium titanate was used, and dispersion stability thereof was evaluated. Further a dielectric film was formed in the same manner as in Example 1, and a dielectric constant at each frequency, flexibility and void content of the obtained film were evaluated. The results are shown in Table 4.

A film having a thickness of not more than 10 μm could not be formed because the obtained film was low in flexibility and fragile.

TABLE 4

| | Comparative Example | |
|---|---|---|
| | 4 | 5 |
| Composition (part by mass) | | |
| Solvent (NMP) | 900 | 900 |
| Aromatic polyamide imide | 100 | 100 |
| Barium titanate | 100 | 150 |
| Additive | Titanium coupling agent (10) | Surfactant S2 (15) |
| Characteristics of composition | | |
| Dispersion stability | X | X |
| Characteristics of film | | |
| Film thickness (μm) | 12.2 | 12.5 |
| Dielectric constant | | |
| 100 Hz | 6 | 7 |
| 1 kHz | 6 | 7 |
| 10 kHz | 5 | 6 |
| 100 kHz | 4 | 5 |
| Flexibility | X | X |
| Content of void (%) | 2.0 | 2.0 |

SEM photographs of the films obtained in Examples 2, 3 and 18 and Comparative Example 3, respectively are shown in FIGS. 1 to 8.

Figure 7:
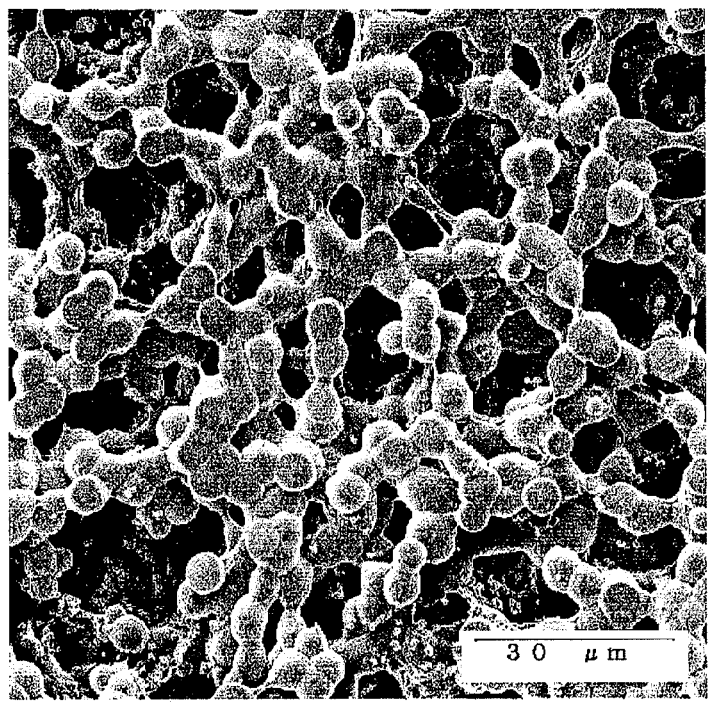
FIG. 7 A SEM photograph (magnification 1,000) of a film produced in Comparative Example 3.
Figure 8:
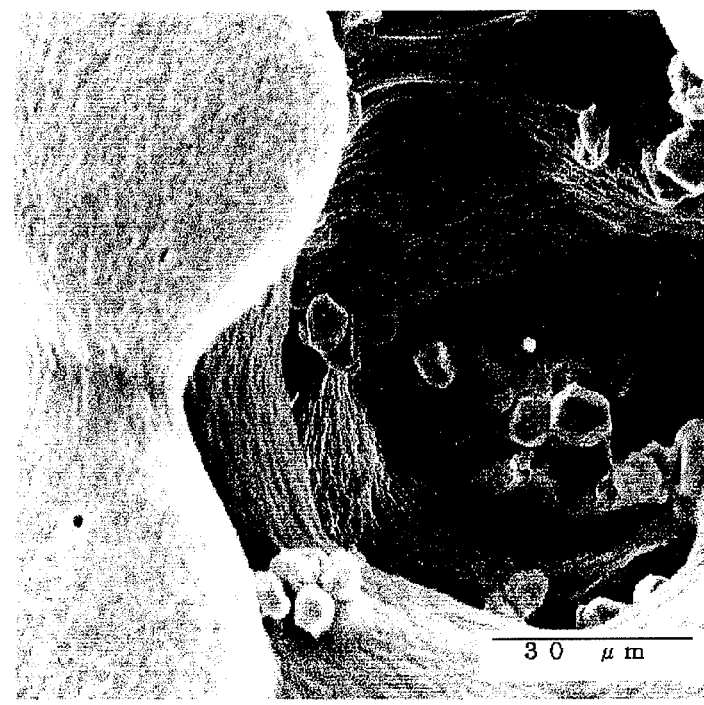
FIG. 8 A SEM photograph (magnification 10,000) of a film produced in Comparative Example 3.

The relation of each example to Fig. number is Example 2 (FIG. 1: 1,000 magnifications, FIG. 2: 10,000 magnifications), Example (FIG. 3: 1,000 magnifications, FIG. 4: 10,000 magnifications), Example 18 (FIG. 5: 1,000 magnifications, FIG. 6: 10,000 magnifications), and Comparative Example 3 (FIG. 7: 1,000 magnifications, FIG. 8: 10,000 magnifications).

It can be seen from these photographs that the surface of the film of the present invention is dense, homogeneous and smooth.

Example 25

Heat Treatment and Preliminary Treatment with Affinity Improving Agent of Barium Titanate Particles Barium titanate particles (BT-01 available from Sakai Chemical Industry Co., Ltd.) were subjected to the following heat treatment and surface treatment.
(Heat Treatment)
Barium titanate particles were subjected to drying treatment at 250° C. for two hours with hot air to remove adsorbed water.
(Surface Treatment)
The heat-treated barium titanate particles and a titanium coupling agent (PLANEACT KR-55 available from AJINOMOTO CO., INC.) in an amount of 5% by mass based on barium titanate particles were forcedly stirred in hexane for 30 minutes with a sand grinder, and then a supernatant was subjected to decantation and then drying at 150° C. for two hours to obtain barium titanate particles surface-treated with the titanium coupling agent.

In 3-liter separable flask, a solution of a mixture of N,N-dimethylacetamide (DMAc) (available from Kishida Chemical Co., Ltd.) and methyl isobutyl ketone (MIBK available from Kishida Chemical Co., Ltd.) (mass ratio of 24.3/19.5) was added to a solution obtained by dissolving a polyvinylidene fluoride (PVdF) polymer (VP832 available from DAIKIN INDUSTRIES, LTD., dielectric constant of 9.8 (1 kHz, 25° C.)) in DMAc to adjust the concentration of PVdF to 2.5% by mass.

To 40 parts by mass of this DMAc solution of PVdF were added 50 parts by mass of the surface-treated barium titanate particles and 2.5 parts by mass of a titanium coupling agent (PLANEACT KR-55).

To the obtained mixture were added glass beads (GB503M available from Potters-Ballotini Co., Ltd.) in an amount of 1.2 times that of the mixture. The resultant mixture was poured into a water-cooled three drum type sand grinder (A•VIEX available from AIMEX), and 60-minute stirring and dispersing treatment was carried out at room temperature at 1,500 rpm. The mixture after the dispersing treatment was passed through a stainless steel mesh (available from MANABE KOGYO CO., LTD., 80 mesh) to remove the glass beads and prepare a dispersion of barium titanate.

Then the obtained dispersion of barium titanate (70 parts by mass), DMAc solution of PVdF having a concentration of 20% by mass (100 parts by mass), DMAc (19 parts by mass) and MIBK (66 parts by mass) were mixed, and thereto were added glass beads in an amount of 1.2 times that of the mixture. The resultant mixture was poured into a water-cooled three drum type sand grinder, followed by forced stirring at 1,500 rpm for two hours to prepare the coating composition of the present invention. This composition was in a homogeneously dispersed state (evaluation: ◯).

The obtained composition was then coated on an aluminum substrate with a bar coater, and dried at 180° C. for one minute with hot air to form an about 4.7 μm thick dielectric film (Film 1).

A dielectric constant at each frequency and a dielectric loss tangent of the obtained film were determined. The results are shown in Table 5.

Also dispersibility (coating composition) and a dielectric constant at each frequency and a dielectric loss tangent (film) were determined with respect to a coating composition prepared by using barium titanate particles (BT-01) surface-treated with a titanium coupling agent but not subjected to heat treatment and a film obtained therefrom (Film 2); a coating composition prepared by using barium titanate particles (BT-01) heat treated but not subjected to surface-treatment with a titanium coupling agent and a film obtained therefrom (Film 3); and a coating composition prepared by using barium titanate particles subjected to neither heat treatment nor surface-treatment with a titanium coupling agent and a film obtained therefrom (Film 4). The results are shown in Table 5.

TABLE 5

|  | Film Number | | | |
| --- | --- | --- | --- | --- |
|  | 1 | 2 | 3 | 4 |
| Composition (part by mass) | | | | |
| PVdF (solid content) | 100 | 100 | 100 | 100 |
| Barium titanate | 180 | 180 | 180 | 180 |
| Heat treatment | conducted | none | conducted | none |
| Surface treatment | conducted | conducted | none | none |
| Titanium coupling agent | 18 | 18 | 9 | 9 |
| (an amount used for surface treatment) | (9) | (9) | (0) | (0) |
| Solvent | | | | |
| DMAc | 540 | 540 | 540 | 540 |
| MIBK | 360 | 360 | 360 | 360 |
| Characteristics of composition | | | | |
| Dispersibility | ◯ | ◯ | ◯ | ◯ |
| Characteristics of film | | | | |
| Film thickness (μm) | 4.7 | 5.1 | 5.1 | 4.8 |
| Dielectric constant | | | | |
| 100 Hz | 186 | 132 | 58 | 67 |
| 1 kHz | 70 | 78 | 51 | 57 |
| 10 kHz | 48 | 62 | 47 | 52 |
| 100 kHz | 40 | 55 | 43 | 47 |
| Dielectric loss tangent (%) | | | | |
| 100 Hz | 194 | 93 | 14 | 16 |
| 1 kHz | 83 | 36 | 8 | 10 |
| 10 kHz | 27 | 14 | 6 | 7 |
| 100 kHz | 11 | 10 | 18 | 19 |

Example 26

A coating composition was prepared by conducting preliminary heat treatment and surface treatment in the same manner as in the production of Film 1 of Example 25 except that barium titanate particles having an average particle size of 30 nm (BTO-30RP available from TODA KOGYO CORP.) were used as barium titanate particles. Dispersibility thereof is shown in Table 6.

Further a film was produced by using this composition, and a dielectric constant at each frequency and a dielectric loss tangent were determined. The results are shown in Table 6.

TABLE 6

|  | Example 26 |
| --- | --- |
| Composition (part by mass) | |
| PVdF (solid content) | 100 |
| Barium titanate | 180 |
| Heat treatment | conducted |
| Surface treatment | conducted |
| Titanium coupling agent | 18 |
| (an amount used for surface treatment) | (9) |

TABLE 6-continued

|  | Example 26 |
| --- | --- |
| Solvent | |
| DMAc | 540 |
| MIBK | 360 |
| Characteristics of composition | |
| Dispersibility | ◯ |
| Characteristics of film | |
| Film thickness (μm) | 3.4 |
| Dielectric constant | |
| 100 Hz | 111 |
| 1 kHz | 64 |
| 10 kHz | 52 |
| 100 kHz | 46 |
| Dielectric loss tangent (%) | |
| 100 Hz | 113 |
| 1 kHz | 38 |
| 10 kHz | 14 |
| 100 kHz | 11 |

Example 27

Into a separable flask were poured 3,200 parts by mass of N,N-dimethylacetamide (DMAc) (available from Kishida Chemical Co., Ltd.) and 800 parts by mass of a polyvinylidene fluoride (PVdF) polymer (KYNAR 761 available from ARKEMA, dielectric constant of 9.6 (100 kHz, 25° C.)), and 3-hour stirring was carried out at 80° C. under nitrogen gas atmosphere with a mechanical stirrer to obtain a solution of PVdF having a concentration of 20% by mass. This polymer solution was a transparent homogeneous solution.

To 4,000 parts by mass of this DMAc solution of PVdF were added 1,120 parts by mass of DMAc and 2,280 parts by mass of methyl isobutyl ketone (MIBK) so that the polymer concentration became 10% by mass.

To 2,000 parts by mass of the obtained PVdF/DMAc/MIBK solution were added 350 parts by mass of barium titanate having an average particle size of 0.1 μm (BT-01 available from Sakai Chemical Industry Co., Ltd.) and 17.5 parts by mass of PLANEACT KR-55 available from AJINOMOTO CO., INC. as a titanium coupling agent, followed by about 10-minute stirring with a homogenizer.

This mixture was subjected to forced stirring and dispersing treatment by a pass method at a peripheral speed of 8 m/sec by using DYNO-MILL (model MULTI-LAB available from WA Bachofen AG) by filling glass beads (average particle size of 0.5 to 0.7 mm) at a filling ratio of 80%. Thus the respective coating compositions of the present invention were obtained in the number of passes of 1 to 5.

The pass method of DYNO-MILL is a method of circulating slurry between a tank and a beads mill, and passing the beads mill once is assumed to be one pass.

Dispersion stability of the obtained coating compositions was determined. The results are shown in Table 7.

Then the obtained coating compositions were coated on an aluminum substrate with a bar coater, and dried with hot air at 180° C. for one minute to form dielectric films.

A thickness, a dielectric constant at each frequency and a dielectric loss tangent of the obtained films were determined. The results are shown in Table 7.

TABLE 7

|  | Number of passes | | | | |
|---|---|---|---|---|---|
|  | 1 | 2 | 3 | 4 | 5 |
| Composition (part by mass) | | | | | |
| PVdF (solid content) | 100 | 100 | 100 | 100 | 100 |
| Barium titanate | 180 | 180 | 180 | 180 | 180 |
| Titanium coupling agent | 9 | 9 | 9 | 9 | 9 |
| Solvent | | | | | |
| DMAc | 540 | 540 | 540 | 540 | 540 |
| MIBK | 360 | 360 | 360 | 360 | 360 |
| Characteristics of composition | | | | | |
| Dispersibility | ○ | ○ | ○ | ○ | ○ |
| Characteristics of film | | | | | |
| Film thickness (μm) | 4.1 | 3.5 | 3.9 | 3.4 | 3.9 |
| Dielectric constant | | | | | |
| 100 Hz | 64 | 62 | 64 | 54 | 56 |
| 1 kHz | 56 | 51 | 53 | 45 | 45 |
| 10 kHz | 45 | 49 | 48 | 40 | 40 |
| 100 kHz | 45 | 43 | 45 | 38 | 37 |
| Dielectric loss tangent (%) | | | | | |
| 100 Hz | 20 | 22 | 20 | 21 | 26 |
| 1 kHz | 10 | 11 | 10 | 11 | 12 |
| 10 kHz | 9 | 6 | 6 | 6 | 7 |
| 100 kHz | 9 | 7 | 9 | 7 | 8 |

Example 28

Barium titanate particles (BT-01 available from Sakai Chemical Industry Co., Ltd.) were subjected to the following heat treatment and surface treatment.
(Heat Treatment)
Barium titanate particles were subjected to drying at 250° C. for two hours with hot air to remove adsorbed water.
(Surface Treatment)
500 parts by mass of the heat-treated barium titanate particles and 25 parts by mass of glycidyl methacrylate (GMA) were forcedly stirred in 500 parts by mass of hexane for one hour with a mechanical stirrer, and then dried at 150° C. for evaporating hexane to obtain barium titanate particles surface-treated with GMA.

Into a 3-liter separable flask were poured 800 parts by mass of N,N-dimethylacetamide (DMAc) (available from Kishida Chemical Co., Ltd.) and 200 parts by mass of a polyvinylidene fluoride (PVdF) polymer (KYNAR 761 available from ARKEMA), and 4-hour stirring was carried out at 80° C. under nitrogen gas atmosphere with a mechanical stirrer to obtain a DMAc solution of PVdF having a concentration of 20% by mass.

500 parts by mass of the barium titanate particles surface-treated with GMA, 242.5 parts by mass of DMAc, 195 parts by mass of methyl isobutyl ketone (MIBK) and 62.5 parts by mass of the obtained DMAc solution of PVdF having a concentration of 20% by mass were mixed, and further thereto was added 25 parts by mass of GMA, followed by one-hour stirring and mixing with a rotor.

To the obtained mixture were added glass beads (GB503M available from Potters-Ballotini Co., Ltd.) in an amount of 1.2 times that of the mixture, and the resultant mixture was poured into a water-cooled three drum type sand grinder (A·VIEX available from AIMEX), followed by 60-minute stirring and dispersing treatment at room temperature at 1,500 rpm. The mixture after the dispersing treatment was passed through a stainless steel mesh (available from MANABE KOGYO CO., LTD., 80 mesh) to remove the glass beads and prepare a dispersion of barium titanate.

Then the obtained dispersion of barium titanate (300.04 parts by mass), the DMAc solution of PVdF having a concentration of 20% by mass (400 parts by mass), DMAc (46.2 parts by mass) and MIBK (244.1 parts by mass) were mixed, followed by forced stirring for one hour with a rotor (BIG-ROTORS BR-2 available from AS-ONE) to prepare the coating composition of the present invention.

The obtained composition was then coated on a stainless steel substrate with a bar coater, and dried at 180° C. for two minutes with hot air to form an about 5 μm thick dielectric film (Film 5).

A dielectric constant and a dielectric loss tangent at 10 kHz of the obtained film were determined. The results are shown in Table 8.

Also a dielectric constant and a dielectric loss tangent at 10 kHz were determined with respect to a coating composition prepared by using barium titanate particles (BT-01) surface-treated with GMA but not subjected to heat treatment without adding GMA in the preparation step of the composition and a film obtained therefrom (Film 6); and a coating composition prepared by using barium titanate particles (BT-01) subjected to heat treatment and surface-treatment with GMA without adding GMA in the preparation step of the composition and a film obtained therefrom (Film 7). The results are shown in Table 8.

TABLE 8

|  | Film Number | | |
|---|---|---|---|
|  | 5 | 6 | 7 |
| Composition (part by mass) | | | |
| PVdF (solid content) | 100 | 100 | 100 |
| Barium titanate | 175 | 175 | 175 |
| Heat treatment | conducted | none | conducted |
| Surface treatment | conducted | conducted | conducted |
| GMA | 17.5 | 8.8 | 8.8 |
| (an amount used for surface treatment) | (8.8) | (8.8) | (8.8) |
| Solvent | | | |
| DMAc | 541 | 541 | 541 |
| MIBK | 360 | 360 | 360 |
| Characteristics of composition | | | |
| Dispersibility | ○ | ○ | ○ |
| Characteristics of film | | | |
| Film thickness (μm) | 5.0 | 4.8 | 5.2 |
| Dielectric constant 10 kHz | 55 | 47 | 47 |
| Dielectric loss tangent (%) 10 kHz | 11 | 10 | 12 |

Example 29

Solubility of PVdF in the solvents (D) shown in Table 9 were evaluated by the following method. The results are shown in Table 9.
(Solubility)
1 g each of PVdF was added to 5 g of the respective solvents, and after stirring at 25° C. for 10 minutes with a mechanical stirrer, the solutions were allowed to stand for one hour, and then a state of the solutions was observed with naked eyes.

The evaluation is made by the following criteria.
○: A solution is colorless and transparent and no gelling occurs.

X: A solution is turned turbid and gelling occurs.

Next, coatability of the obtained solution of PVdF was evaluated by the following method. The results are shown in Table 9.

(Coatability)

A solution of PVdF is coated on a polyester film with a bar coater, and dried with hot air at 180° C. for one minute to make a film. The obtained film is observed with naked eyes to check to see whether or not a pin hole is present on the film. When a pin hole is found, it is indicated by X, and when no pin hole is found, it is indicated by ○.

The solvents used in this Example are as follows. A dielectric constant and a surface tension of each of the solvents are values shown in the Solvent Handbook (Yuasa et al., Kodansha Ltd. (1976)). In the case of a solvent mixture, a dielectric constant and a surface tension thereof are values calculated from an arithmetic mean value in a mass ratio of each solvent.

NMP: N-methylpyrrolidone (available from Kishida Chemical Co., Ltd.), dielectric constant (25° C.): 32, surface tension (25° C.): 41 dyn/cm DMF: N,N-dimethylformamide (available from Kishida Chemical Co., Ltd.), dielectric constant (25° C.): 36.71, surface tension (25° C.): 35.2 dyn/cm DMAc: N,N-dimethylacetamide (available from Kishida Chemical Co., Ltd.), dielectric constant (25° C.): 37.78, surface tension (30° C.): 32.43 dyn/cm MIBK: Methyl isobutyl ketone (available from Kishida Chemical Co., Ltd.), dielectric constant (20° C.): 13.11, surface tension (25° C.): 25.4 dyn/cm MAK: 2-Heptanone (available from Kishida Chemical Co., Ltd.), dielectric constant (22° C.): 9.77, surface tension (25° C.): 34.5 dyn/cm DEC: Diethylene carbonate (available from Tokyo Chemical Industry Co., Ltd.), dielectric constant (20° C.): 2.820, surface tension (30° C.): 25.47 dyn/cm

TABLE 9

| Solvent | Mixing ratio (mass ratio) | Dielectric constant | Surface tension (dyn/cm) | Solubility | Coatability |
|---|---|---|---|---|---|
| NMP | — | 32 | 41 | ○ | ○ |
| DMF | — | 36.71 | 35.2 | ○ | ○ |
| DMAc | — | 37.78 | 32.43 | ○ | ○ |
| DMF/MIBK | 60/40 | 27.3 | 31.3 | ○ | ○ |
| DMF/MAK | 60/40 | 25.9 | 34.9 | ○ | ○ |
| DMF/DEC | 60/40 | 23.2 | 31.3 | ○ | ○ |
| DMAc/MIBK | 60/40 | 27.9 | 29.6 | ○ | ○ |
| DMAc/MAK | 60/40 | 26.6 | 33.2 | ○ | ○ |
| DMAc/DEC | 60/40 | 23.8 | 29.6 | ○ | ○ |

Example 30

Into a 5-liter separable flask were poured 800 parts by mass of N,N-dimethylacetamide (DMAc) (available from Kishida Chemical Co., Ltd.) and 200 parts by mass of a polyvinylidene fluoride (PVdF) polymer (KYNAR 761 available from ARKEMA), and 3-hour stirring was carried out at 80° C. under nitrogen gas atmosphere with a mechanical stirrer to obtain a DMAc solution of PVdF having a concentration of 20% by mass. This solution was a transparent homogeneous solution.

To 62.5 parts by mass of this DMAc solution of PVdF having a concentration of 20% by mass were added 242.5 parts by mass of DMAc and 195 parts by mass of MIBK to adjust the PVdF concentration to 2.5% by mass. Then thereto were added 500 parts by mass of barium titanate (BT-01 available from Sakai Chemical Industry Co., Ltd.) and 25 parts by mass of a titanium coupling agent (PLANEACT KR-55 available from AJINOMOTO CO., INC.).

To the obtained mixture were added glass beads (GB503M available from Potters-Ballotini Co., Ltd.) in an amount of 1.2 times that of the mixture, and the resultant mixture was poured into a water-cooled three drum type sand grinder (A•VIEX available from AIMEX), followed by 60-minute stirring and dispersing treatment at room temperature at 1,500 rpm. The mixture after the dispersing treatment was passed through a stainless steel mesh (available from MANABE KOGYO CO., LTD., 80 mesh) to remove the glass beads and prepare a dispersion of barium titanate.

Then the obtained dispersion of barium titanate (1,500 parts by mass), the DMAc solution of PVdF having a concentration of 2.5% by mass (2,000 parts by mass), DMAc (231 parts by mass) and MIBK (1,220 parts by mass) were mixed and forcedly stirred for two hours with a mechanical stirrer, followed by filtration with a stainless steel mesh (available from MANABE KOGYO CO., LTD., 200 mesh) to prepare the coating composition of the present invention. This composition was in a homogeneously dispersed state.

The obtained coating composition was coated on a polyester film (38 μm thick) by using a micro gravure coater (OS-300 available from YASUI SEIKI CO., LTD.) at 1.2 rpm of a 45 mesh micro gravure roll at a peripheral speed of 5 m/min, and the coated film was passed 6 m in a drying oven of 150° C. and then passed 6 m in a drying oven of 180° C. Thus two 100 m long laminated films having a coating layer of 200 mm wide×5.2 μm thick (dielectric film layer) were prepared.

The coating layer was peeled from the laminated film and wound at a peripheral speed of 1.5 m/min to obtain a dielectric film of 200 mm wide×5.2 μm thick.

Example 31

A dispersion was prepared and a dielectric film was produced in the same manner as in Example 27 except that 400 parts by mass of polyvinylidene fluoride (PVdF) (KYNAR 761 available from ARKEMA) and 400 parts by mass of polyvinylidene fluoride/hexafluoropropylene copolymer (KYNAR 2801 available from ARKEMA) were used as a polymer component.

A film thickness, a dielectric constant and a dielectric loss tangent at each frequency of the obtained film were determined. As a result, the film thickness was 5.2 μm; the dielectric constants were 65, 58, 51 and 48 at 100 Hz, 1 kHz, 10 kHz and 100 kHz, respectively; and the dielectric loss tangents (%) were 12, 8, 4 and 4 at 100 Hz, 1 kHz, 10 kHz and 100 kHz, respectively.

Example 32

The film produced in Example 27 was subjected to press-treatment by passing through two calender rolls at a speed of 1 m/min at 60° C. and 120° C. at a load of 1 ton and 4 tons. In order to evaluate surface smoothness of the press-treated film, a reflectance was measured by the following method.

[Measuring Method of Reflectance]

A reflectance of a thin film is measured in an applied measuring mode by using a spectrophotometer (U-4100) and a 5 C plus reflection attached equipment available from Hitachi High-Technologies Corporation.

A visible light reflectance (% R) measured at a scanning speed of 300 nm/min at a wavelength of 1,000 to 300 nm is assumed to be a reflectance.

As a result, while a reflectance of an untreated film was 0.31%, reflectances in the cases of press-treatment at 60° C. at a load of 1 ton, press-treatment at 60° C. at a load of 4 tons, press-treatment at 120° C. at a load of 1 ton and press-treatment at 120° C. at a load of 4 tons were 0.41%, 0.56%, 1.05% and 1.91%, respectively. Thus surface smoothness was improved.

Example 33

The film produced in Example 31 was subjected to press-treatment by passing through two calender rolls at a speed of 1 m/min at 120° C. at a load of 1 ton and 4 tons. In order to evaluate surface smoothness of the press-treated film, a reflectance was measured by the method of Example 32.

As a result, while a reflectance of an untreated film was 0.31%, a reflectance in the case of press-treatment at 120° C. at a load of 1 ton was 4.32% and a reflectance in the case of press-treatment at 120° C. at a load of 4 tons was 4.38%. Thus surface smoothness was greatly improved.

Example 34

To 50 parts by mass of a methyl ethyl ketone (MEK) solution were added 50 parts by mass of barium titanate having an average particle size of 0.1 p.m (BTO1 available from Sakai Chemical Industry Co., Ltd.) and 2.5 parts by mass of PLANEACT KR55 (available from AJINOMOTO CO., INC.) as a titanium coupling agent.

Into a three drum type sand grinder (A•VIEX available from AIMEX) were poured this mixture and glass beads (GB503M available from Potters-Ballotini Co., Ltd.) in the same mass amount, followed by 60-minute dispersion treatment at room temperature at 1,000 rpm. After the dispersing treatment, the mixture was passed through a stainless steel mesh to remove the glass beads.

This dispersion solution was added to a 20% by mass MEK solution of a VdF/TFE copolymer (84/16 in molar ratio) so that the amount of barium titanate became 100% by mass based on the VdF/TFE copolymer. The obtained solution was coated on an aluminum substrate with a bar coater, and dried at 120° C. for two minutes with a hot air dryer to obtain a 5.5 μm thick highly dielectric film of the present invention. Then physical properties of the film were measured.

As a result, a dielectric constant was 31, and a dielectric loss tangent (%) was 3.2.

INDUSTRIAL APPLICABILITY

The highly dielectric film of the present invention has high dielectric constant, can be formed into a thin film, is excellent in winding property (flexibility), and yet can be easily produced by a simple method.

The invention claimed is:

1. A film condenser comprising a highly dielectric film and an electrode formed on a surface of the film, the highly dielectric film comprising:
   (A) a vinylidene fluoride polymer,
   (B) barium titanate oxide particles, and
   (C) an affinity improving agent represented by the following formula:

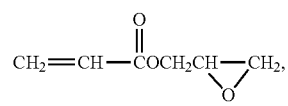

wherein said barium titanate oxide particles (B) and said affinity improving agent (C) are contained in amounts of 50 to 400 parts by mass and 0.01 to 20 parts by mass, respectively based on 100 parts by mass of the vinylidene fluoride polymer (A), wherein a thickness of the highly dielectric film is 3 μm to 9 μm, and the highly dielectric film is a single film separated from a substrate.

2. The film condenser of claim 1, wherein aluminum as the electrode is deposited on the highly dielectric film.

3. A film condenser comprising a wound body of a highly dielectric film and an electrode formed on a surface of the film, the highly dielectric film comprising:
   (A) a vinylidene fluoride polymer,
   (B) barium titanate oxide particles, and
   (C) an affinity improving agent represented by the following formula:

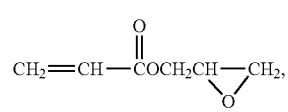

wherein said barium titanate oxide particles (B) and said affinity improving agent (C) are contained in amounts of 50 to 400 parts by mass and 0.01 to 20 parts by mass, respectively based on 100 parts by mass of the vinylidene fluoride polymer (A), wherein a thickness of the highly dielectric film is 3 μm to 9 μm, and the highly dielectric film is a single film separated from a substrate.

* * * * *